(12) United States Patent
Heid et al.

(10) Patent No.: US 6,531,870 B2
(45) Date of Patent: Mar. 11, 2003

(54) MAGNETIC RESONANCE APPARATUS WITH A GRADIENT COIL SYSTEM AND AN ELECTRICALLY CONDUCTIVE STRUCTURE

(75) Inventors: Oliver Heid, Gunzenhausen (DE); Markus Vester, Nuernberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/036,906

(22) Filed: Dec. 21, 2001

(65) Prior Publication Data

US 2002/0105329 A1 Aug. 8, 2002

(30) Foreign Application Priority Data

Dec. 21, 2000 (DE) .......................................... 100 64 110
Nov. 19, 2001 (DE) .......................................... 101 56 770

(51) Int. Cl.⁷ ................................................ G01V 3/00
(52) U.S. Cl. ...................................... 324/318; 324/319
(58) Field of Search ................................ 324/318, 319, 324/320, 321, 322, 300, 306, 307, 309, 312, 314

(56) References Cited

U.S. PATENT DOCUMENTS

| 4,585,995 A | 4/1986 | Flugan | 324/322 |
| 4,703,275 A | 10/1987 | Holland | 324/318 |
| 5,280,247 A | * | 1/1994 | DeMeester et al. | 324/318 |
| 5,886,548 A | * | 3/1999 | Doty et al. | 324/318 |
| 6,011,394 A | * | 1/2000 | Petropoulos et al. | 324/318 |

FOREIGN PATENT DOCUMENTS

| DE | 197 26 332 | 12/1998 |
| EP | 0 317 853 | 11/1989 |
| GB | 2 207 764 | 2/1989 |

OTHER PUBLICATIONS

"Numerical Recipes In C. The Art of Scientific Computing," Press et al. (1992) pp. 408–430.

* cited by examiner

Primary Examiner—Louis Arana
(74) Attorney, Agent, or Firm—Schiff Hardin & Waite

(57) ABSTRACT

A magnetic resonance apparatus has a gradient coil system having at least one gradient coil for generating a magnetic gradient field and an electrically conductive structure that is arranged and fashioned such that the gradient field is damped in a region outside the imaging volume of the magnetic resonance apparatus, and such that a magnetic field of the structure caused by the gradient field via induction effects is similar in structure to the gradient field, at least within the imaging volume.

18 Claims, 2 Drawing Sheets

MAGNETIC RESONANCE APPARATUS WITH A GRADIENT COIL SYSTEM AND AN ELECTRICALLY CONDUCTIVE STRUCTURE

BACKGROUND OF THE INVENTION

1. Field of the Invention

The present invention is directed to a magnetic resonance apparatus.

2. Description of the Prior Art

Magnetic resonance technology is a known technique for acquiring images of the inside of the body of an examination subject. In a magnetic resonance apparatus, rapidly switched gradient fields that are generated by a gradient coil system are superimposed on a static basic magnetic field that is generated by a basic field magnet system. The magnetic resonance apparatus further has a radio-frequency system that emits radio-frequency signals into the examination subject for triggering magnetic resonance signals, and picks up the generated magnetic resonance signals. A computer produces magnetic resonance images on the basis of these signals.

The gradient coil system thereby usually has three gradient coils. Each of the gradient coil generates a gradient field for a specific spatial direction and, in the desired, ideal case, exclusively generates a main field component that is co-linear with the basic magnetic field, at least within an imaging volume. The main field component has a prescribable principal gradient that, in the desired, ideal case, is of the same magnitude independent of location at any arbitrary point in time, at least within the imaging volume. Since the gradient field is a time-variable magnetic field, these features apply for every point in time; however, the intensity of the principal gradient is variable from one point in time to another point in time. The direction of the principal gradient is usually rigidly prescribed by the design of the gradient coil.

Due to Maxwell's fundamental equations and contrary to the desired, ideal case, however, no gradient coil can be fashioned that exclusively generates the aforementioned main field component across the imaging volume. Among other things, at least one accompanying field component that is directed perpendicularly to the main field component unavoidably accompanies the main field component.

Appropriate currents are set in the gradient coil for generating the gradient field. The amplitudes of the required currents amount to up to several 100 A. The current rise and decay rates (slew rate) amount to up to several 100 kA/s. The gradient coils are connected to a controlled gradient amplifier for the current supply.

The gradient coil system is usually surrounded by conductive structures, in which eddy currents are induced due to the switched gradient fields. Examples of such conductive structures are a vacuum vessel and/or a cryo-shield of a superconducting basic field magnet system. The fields generated by the eddy currents are unwanted because they weaken the gradient fields and distort its time curve if counter-measures are not undertaken. This leads to a degradations of the quality of magnetic resonance images. Further, the eddy currents induced in components of a superconducting basic field magnet system effect a heating of these components, so that a noticeably increased refrigerating capacity must be employed for maintaining the super-conduction. Given a basic field magnet system with a permanent magnet, the heating as a consequence of eddy currents leads to an unwanted modification of properties of the basic magnetic field, and, further, the eddy currents can even produce a re-magnetization of the permanent magnet.

Such eddy current fields can be compensated to a certain degree by a corresponding pre-distortion of a reference current quantity of the gradient coil. However, only eddy current fields that are similar to image the gradient field, i.e. are like the gradient field in terms of their course, can be compensated by the pre-distortion. ("Similar" is used herein in the geometric sense.) The basic functioning of the known pre-distortion technique is disclosed, for example, in U.S. Pat. Nos. 4,585,995 and in 4,703,275. The calculation of the pre-distortion is thereby essentially based on the perception that induced and decaying eddy currents can be described by a specific number of e-functions of different time constants.

Since, however, there are also eddy currents that are not similar to the gradient field, additional spatial field distortions of a higher order arise. Among other things, actively shielded gradient coils are utilized in order to largely compensate these field distortions. A shielding coil belonging to a gradient coil usually has a lower number of turns and is interconnected with the gradient coil such that the shielding coil has the same current therein as the gradient coil but in the opposite direction. Limits exist on the compensating effect of the shielding coil because, due to a conductor arrangement of the shielding coil, a current flow can be controlled only in the rigidly prescribed paths corresponding to the conductor arrangement. Further, the shielding coil develops its compensating effect and, accompanying this, an attenuation of the gradient field in the imaging volume of the magnetic resonance apparatus, regardless of whether the gradient field is switched rapidly or slowly. Particularly given extremely low frequencies of the gradient field, the compensating effect of the shielding coil is not required since a switched gradient field with very low frequencies causes hardly any eddy currents.

SUMMARY OF THE INVENTION

An object of the invention is to provide an improved magnetic resonance apparatus wherein—among other things—unwanted consequences of a switched gradient field can be controlled in an economic way.

This object is achieved in a magnetic resonance apparatus having a gradient coil system having at least one gradient coil for generating a magnetic gradient field, and an electrically conductive structure that is arranged and fashioned such that the gradient field is damped in a region outside the imaging volume of the magnetic resonance apparatus, and such that a magnetic field caused by the gradient field via induction effects is similar in structure to the gradient field, at least within the imaging volume.

As a result, a gradient coil system wherein shielding coils can be completely foregone can be fashioned for a magnetic resonance apparatus. Compared to a gradient coil system with shielding coils, this means a substantial savings potential in view of volume material, and costs. The inherently unwanted consequences of the switched gradient field are completely governed due to the presence of the structure in combination with the initially described pre-distortion. Compared to the solution with shielding coils, a further advantage of the magnetic resonance apparatus with the electrically conductive structure is that the effect of the structure is merely limited to time-varying gradient fields; a maximally obtainable gradient intensity for a longer time span with a gradient field that does not vary over time is not reduced.

For a gradient coil system that is fashioned approximately hollow-cylindrically, the electrically conductive structure is fashioned approximately like the shell of a barrel and, for example, is arranged between the gradient coil system and a basic field magnet system of the magnetic resonance apparatus. An exact fashioning of the structure is dependent on the conductor arrangement of the gradient coils and can be exactly defined via a numerical optimization method.

The exact fashioning of the structure can be determined, for example, with a procedure wherein conductor arrangements of gradient coils are prescribed as non-dislocatable, and the optimum fashioning of the structure is sought proceeding from a start value of the structure, for example from a fashioning as ideal barrel shell. To that end, an eddy current distribution on the structure that is caused by a flow of current in one of the gradient coils is calculated, with the assistance of a finite element method via the quasi-static Maxwell equations. The eddy current distribution thereby causes a magnetic eddy current field that disturbs magnetic resonance exposures. Further, an evaluation criterion is defined, for example an average quadratic deviation of a component of the eddy current field pointing in the direction of the basic magnetic field, from a correspondingly directed component and from a component of a gradient field caused by the current-permeated gradient coil on an edge of an intended imaging volume of the magnetic resonance apparatus, this latter component being provided with a scaling factor. The scaling factor describes the factor by which an intensity of the gradient field is reduced by the presence of the structure and the eddy current field accompanying this. For example, the scaling factor can be defined as a constant.

For finding the optimum fashioning of the structure, geometrical parameters of the structure are then varied in prescribable limits that, for example, are determined by a basic field magnet system and/or and acceptance space of the magnetic resonance apparatus for examination subjects and/or a geometrical capability of realizing the structure. These parameters are varied such that the evaluation criterion becomes minimal, or lower than a prescribable threshold. Known methods suitable for numerical optimization are, for instance, the Gauss-Newton method and other methods as described, for example, in the book by W. H. Press et al., "Numerical Recipes in C. The art of scientific computing", Cambridge University Press, 1992, pages 408 through 430. A meaningful threshold for the evaluation criterion, for example, is 3 ppm with reference to a basic magnetic field amplitude of the magnetic resonance apparatus, since this threshold represents a still distinguishable, relative frequency difference between the fat protons and water protons that are dominant in the human and animal bodies.

In another procedure, a geometry of the structure, for example in the fashioning as ideal barrel shell, is defined and conductor arrangements of the gradient coils are sought proceeding therefrom. The aforementioned evaluation criterion is also taken into account in a design method for the conductor arrangements. For example, German OS 197 26 332 discloses a design method for a conductor arrangement of a gradient coil, whereby a current distribution on a surface of the gradient coil is calculated such with a target function to be minimized and that allows boundary conditions that a gradient field that can be generated with the gradient coil reaches prescribable values exactly or optimally well at predetermined points. The aforementioned evaluation criterion is taken into account in this design method such that the target function has the aforementioned evaluation criterion additively added to it in addition to criteria relating, for example, to an inductance and a dissipated power of the gradient coil. A remaining residual disturbance due to the eddy current field can be controlled by the weighting of the evaluation criterion with a weighting factor. If the scaling factor that is kept variable, further, this can thereby be at the same time.

In another procedure, the two procedures described above are combined. To that end, for example in alternation, an adaptation of a geometry of the structure to conductor arrangements of gradient coils and, following thereupon, an adaptation of the conductor arrangements to the previously found geometry of the structure ensue. The adaptation of the conductor arrangement following the adaptation of the geometry is advantageous because the adaptation of the geometry of the geometry of the structure, as experience has shown, permits less latitude for optimization than the adaptation of the conductor arrangements and because the structure must yield adequately slight residual disturbances for all three gradient coils, which are usually different from one another. In another embodiment given the combined procedure, a correspondingly combined, non-linear optimization task for the structure together with the gradient coils is directly solved.

In a further embodiment, the two-dimensionally curved geometry of the aforementioned barrel shell-shaped structure—as a rigid smooth component (i.e. no bulges or projections)—can be integrated into a device component of the magnetic resonance apparatus, for a vacuum vessel of a superconducting basic field magnet system In a further embodiment, the structure has a cooling device for cooling the structure allocated to it. As a result, the heat arising due to the induction effects can be eliminated in a simple way, particularly given a fashioning of the structure as an essentially separate device component of the magnetic resonance apparatus. For example, the sensitive temperature design and temperature maintenance of a basic field magnet system need not be modified.

DESCRIPTION OF THE PREFERRED EMBODIMENTS

Figure 1:
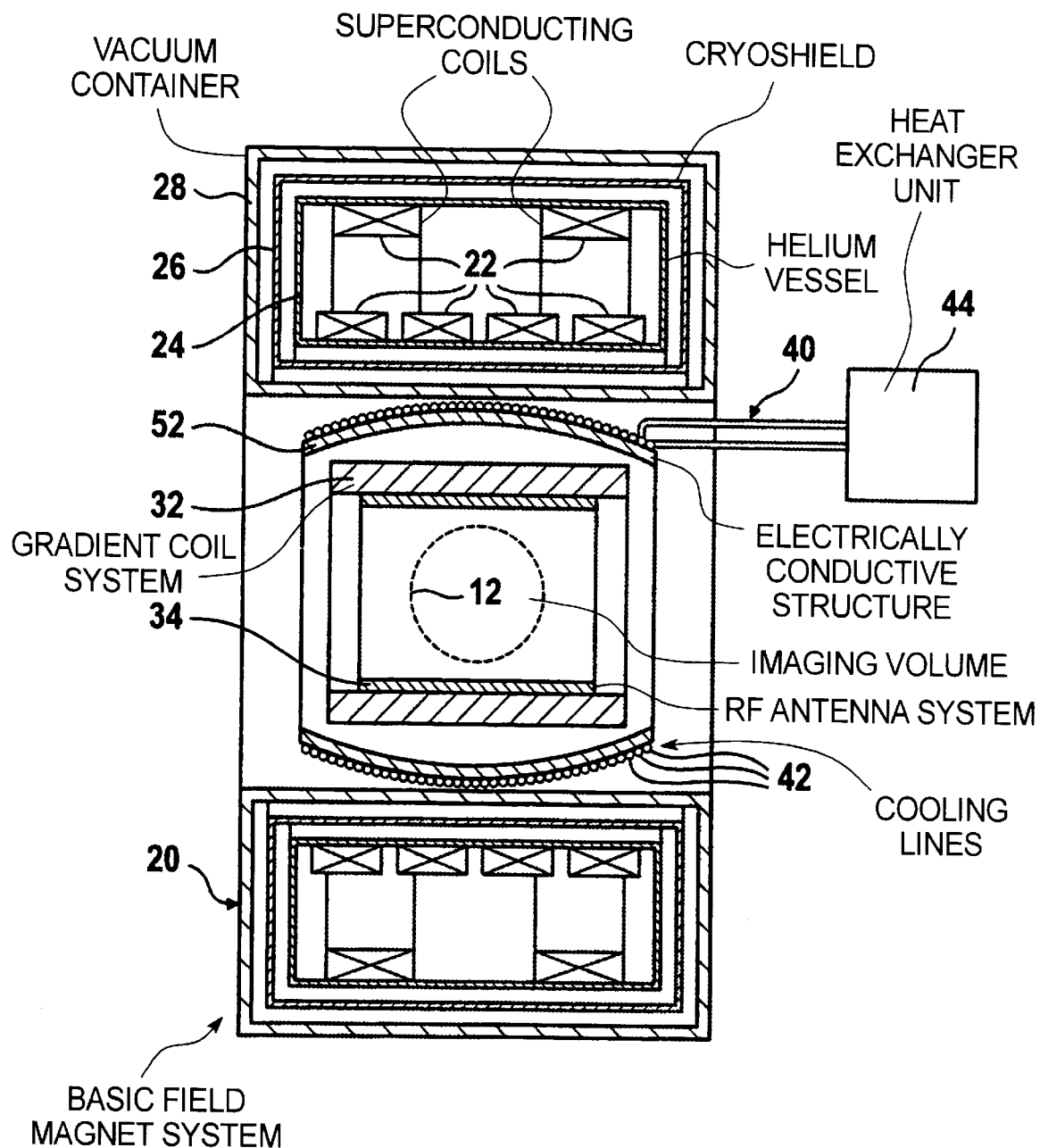
FIG. 1 is a longitudinal section of a magnetic resonance apparatus with a barrel shell-shaped, electrically conductive structure in accordance with the invention.

As an exemplary embodiment of the invention, FIG. 1 shows a longitudinal section through a magnetic resonance apparatus having a barrel shell-shaped, electrically conductive structure 52. The apparatus has a superconducting basic field magnet system 20 for generating a basic magnetic field that is homogeneous at least within an imaging volume 12 of the apparatus. The system 20 contains a hollow-cylindrical helium vessel 24 in which superconducting coils 22 are arranged, these being cooled by the liquid helium that surrounds them. The helium vessel 24 is surrounded by at least one cry-oshield 26, the effect of the latter being that optimally little thermal radiation penetrates to the helium vessel 24. The cryo-shield 26 is thereby surrounded by a hollow-cylindrical vacuum container 28.

The barrel shell-shaped, electrically conductive structure 52, a gradient coil system 32 as well as an RF antenna system 34 are arranged in a cylindrical opening of the vacuum container 28. The gradient coil system 32 is fashioned for generating temporally varying gradient fields at least within the imaging volume 12. For triggering magnetic resonance signals, radio-frequency signals can be emitted into a region to be imaged in an examination subject, who is supported in the imaging volume 12, with the antenna system 34, and the generated magnetic resonance signals, used to produce basis magnetic resonance images, are registered.

For generating the gradient fields, suitable electrical currents are set in the gradient coils of the gradient coil system 32. These currents exhibit the pre-distortion that was initially described. The pre-distortion is controlled such that a magnetic field induced in the structure 52 by the flow of current in one of the gradient coils together with the field generated by the gradient coil generates a magnetic gradient field—at least in the imaging volume 12—that has a desired time curve of a gradient intensity. Since the structure 52 is designed such that the magnetic field is similar to the field generated by the gradient coil, particularly directly proportional thereto, the magnetic gradient field is undistorted, particularly in the direction of the basic magnetic field, at least in the imaging volume. This is important for high-quality undistorted magnetic resonance images.

The structure 52 develops its shielding effect with respect to the fields generated by the gradient coils toward the outside, in the direction of the basic field magnet system, so that no eddy currents arise in the basic field magnet system 20, and, among other things beyond this, no undesired heating of the basic field magnet system 20 can occur.

Since a heating of the structure 52 occurs due to the aforementioned induction effects during operation, a cooling device 40 for cooling the structure 52 is allocated to the structure 52. The cooling device 40 has cooling lines 42 attached to the structure 52 for conducting a coolant, for example cooling water, therethrough. For circulating the coolant as well as for transferring the heat absorbed by the coolant at the structure 52 to the environment, the cooling lines are connected to a circulation and heat exchanger unit 44 that performs these tasks.

Figure 2:
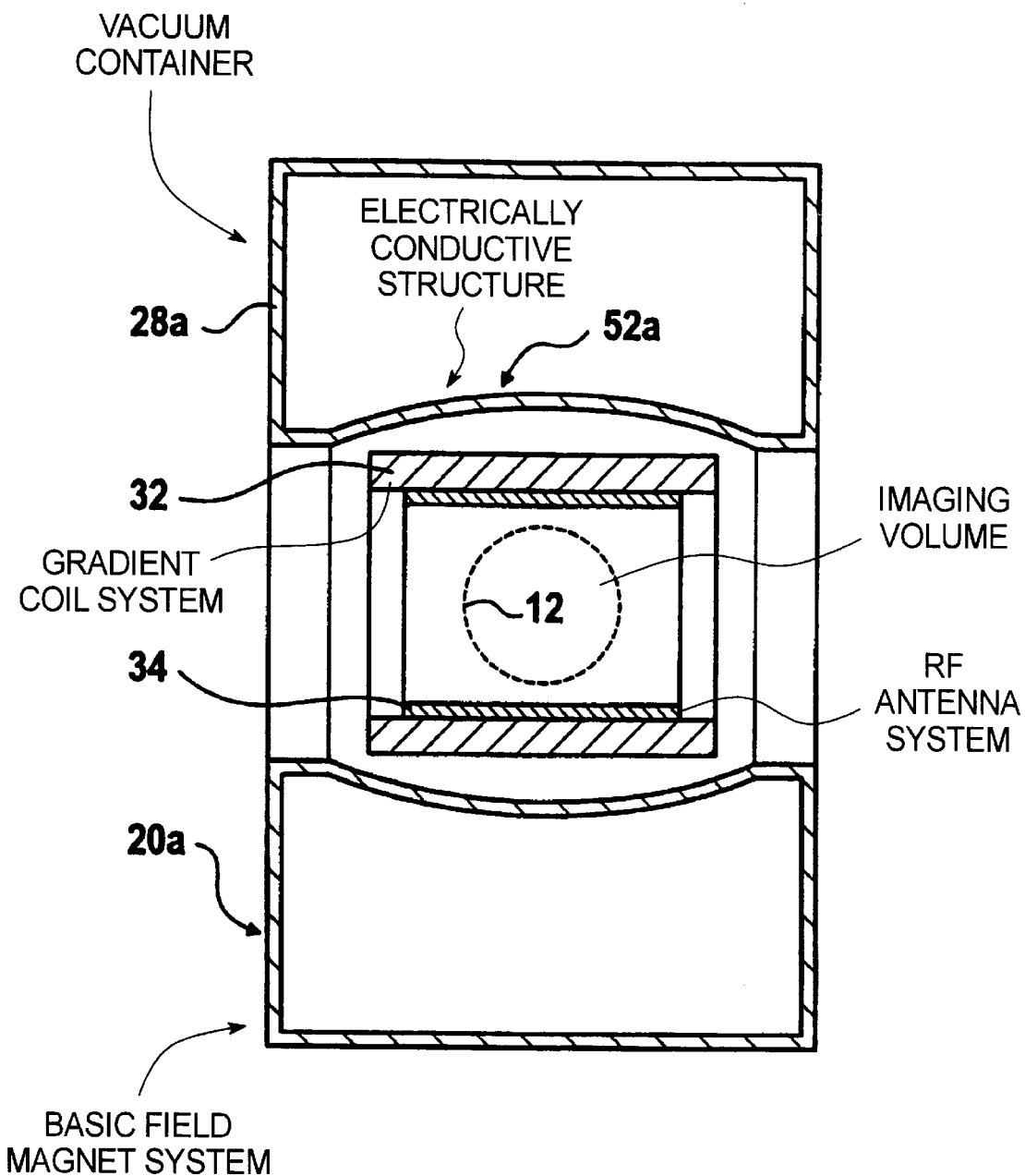
FIG. 2 is a longitudinal section of a magnetic resonance apparatus having a superconducting basic field magnet system into which a barrel shell-shaped, electrically conductive structure is integrated in accordance with the invention.

As a further exemplary embodiment of the invention, FIG. 2 shows a longitudinal section of a magnetic resonance apparatus with a superconducting basic field magnet system 20a whose vacuum container 28a has a region fashioned as a barrel shell-shaped, electrically conductive structure 52a. Compared to FIG. 1, the barrel shell-shaped, electrically conductive structure 52a—without the cooling device 40 of FIG. 1—is integrated into the vacuum container 28a as a component part of the superconducting basic field magnet system 20a. Accordingly, a cooling of the structure 52a is co-assumed by the basic field magnet system 20a, which must be correspondingly designed and operated to that effect. Otherwise, that set forth with respect to FIG. 1 applies.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus, comprising:
a magnetic resonance scanner, having an imaging volume, and including a gradient coil system having at least one gradient coil which generates a magnetic gradient field; and
a passive electrically conductive structure disposed to inductively interact with said gradient field for damping said gradient field in a region outside of said imaging volume by producing a magnetic field by inductive interaction with said gradient field having a field structure similar to an overall field structure of said gradient field, including higher order distortions, at least within said imaging volume.

2. A magnetic resonance apparatus as claimed in claim 1 wherein said electrically conductive structure, by said inductive interaction with said gradient field, produces a magnetic field which is directly proportional to said gradient field.

3. A magnetic resonance apparatus as claimed in claim 1 wherein said electrically conductive structure includes a cooling device for cooling said electrically conductive structure.

4. A magnetic resonance apparatus as claimed in claim 3 wherein said cooling device circulates liquid coolant in said electrically conductive structure.

5. A magnetic resonance apparatus as claimed in claim 1 wherein said gradient coil system has a hollow-cylindrical configuration.

6. A magnetic resonance apparatus as claimed in claim 5 wherein said electrically conductive structure has a shape approximating a barrel shell.

7. A magnetic resonance apparatus as claimed in claim 1 wherein said magnetic resonance scanner further has a basic field magnet system.

8. A magnetic resonance apparatus as claimed in claim 7 wherein said basic field magnet system comprises a superconducting basic field magnet.

9. A magnetic resonance apparatus as claimed in claim 7 wherein said region outside of said imaging volume encompasses at least a portion of said basic field magnet system.

10. A magnetic resonance apparatus as claimed in claim 7 wherein at least a portion of said electrically conductive structure is disposed between said gradient coil system and said basic field magnet system.

11. A magnetic resonance apparatus as claimed in claim 7 wherein at least a portion of said electrically conductive structure is allocated to said gradient coil system.

12. A magnetic resonance apparatus as claimed in claim 7 wherein at least a portion of said electrically conductive structure is allocated to said basic field magnet system.

13. A magnetic resonance apparatus as claimed in claim 7 wherein at least a portion of said basic field magnet system forms a part of said electrically conductive structure.

14. A magnetic resonance apparatus as claimed in claim 1 wherein said gradient coil system comprises a conductor arrangement having a conductor configuration adapted to a configuration of said electrically conductive structure.

15. A method for operating a magnetic resonance apparatus, comprising the steps of:
providing a magnetic resonance scanner having an imaging volume;
generating a magnetic gradient field in said imaging volume with a gradient coil system having at least one gradient coil which generates said magnetic gradient field;
damping said gradient field in a region outside of said imaging volume with a passive electrically conductive structure; and
producing a magnetic field with said electrically conductive structure, by inductive interaction with said gradient magnetic field, that has a field structure that is similar to an overall field structure of said gradient field, including higher order distortions, at least within said imaging volume.

16. A method as claimed in claim 15 comprising circulating a coolant in said electrically conductive structure.

17. A method as claimed in claim 15 comprising shaping said gradient coil system to approximate a hollow cylinder, and shaping said electrically conductive structure to approximate a barrel shell.

18. A method as claimed in claim 15 wherein said magnetic resonance scanner includes a basic field magnet system, and further comprising forming at least a part of said electrically conductive structure by at least a part of said basic magnet system.

* * * * *